(12) United States Patent
Ishikawa

(10) Patent No.: US 6,590,227 B2
(45) Date of Patent: Jul. 8, 2003

(54) ACTIVE MATRIX DISPLAY DEVICE

(75) Inventor: Akira Ishikawa, Kanagawa (JP)

(73) Assignee: Semiconductor Energy Laboratory Co., Ltd., Kanagawa-ken (JP)

( * ) Notice: Subject to any disclaimer, the term of this patent is extended or adjusted under 35 U.S.C. 154(b) by 0 days.

(21) Appl. No.: 09/750,371

(22) Filed: Dec. 27, 2000

(65) Prior Publication Data
US 2001/0005019 A1 Jun. 28, 2001

(30) Foreign Application Priority Data
Dec. 27, 1999 (JP) ............................. 11-369935

(51) Int. Cl.$^7$ ............................. H01L 27/105
(52) U.S. Cl. ..................... 257/68; 257/59; 257/72
(58) Field of Search ................ 257/59, 68, 72; 438/155

(56) References Cited

U.S. PATENT DOCUMENTS

| | | | | |
|---|---|---|---|---|
| 4,639,087 A | * | 1/1987 | Cannella | 257/59 |
| 4,759,610 A | * | 7/1988 | Yanagisawa | 257/59 |
| 5,060,036 A | * | 10/1991 | Choi | 257/350 |
| 5,510,916 A | * | 4/1996 | Takahashi | 349/110 |
| 5,587,329 A | * | 12/1996 | Hseuh et al. | 438/155 |
| 5,643,826 A | | 7/1997 | Ohtani et al. | 438/162 |
| 5,923,962 A | | 7/1999 | Ohtani et al. | 438/150 |
| 6,075,580 A | * | 6/2000 | Kouchi | 257/59 |
| 6,084,579 A | * | 7/2000 | Hirano | 315/169.3 |
| 6,204,520 B1 | * | 3/2001 | Ha et al. | 257/66 |
| 6,320,204 B1 | * | 11/2001 | Hirabayashi et al. | 257/296 |
| 6,331,722 B1 | * | 12/2001 | Yamazaki et al. | 257/347 |

FOREIGN PATENT DOCUMENTS

| | | | | |
|---|---|---|---|---|
| EP | 0 464 579 A2 | * | 8/1992 | G02F/1/136 |
| JP | 4-04-179270 | * | 6/1992 | 257/59 |
| JP | 4-07-056193 | * | 3/1995 | G02F/1/136 |
| JP | 07-130652 | | 5/1995 | |

* cited by examiner

Primary Examiner—George Eckert
(74) Attorney, Agent, or Firm—Fish & Richardson P.C.

(57) ABSTRACT

The present invention has the object of obtaining a display device with a sufficient storage property without degrading the aperture ratio when high definition is to be achieved for the display device.

In the active matrix display device, a good storage property can be obtained without degrading the aperture ratio by disposing the storage element below the pixel TFT area as shown in FIG. 3. Moreover, even when the area of the capacitor element is reduced, a sufficient amount of the capacitor can be obtained by laminating a plurality of capacitor elements.

35 Claims, 11 Drawing Sheets

300: glass substrate, 301: first wiring
302: dielectric, 303: second wiring
304: insulating film, 305: source region
306: drain region, 307: gate insulating film
308: gate wiring
309: first interlayer insulating film (silicon oxide)
310: drain wiring, 311: source wiring
312: second interlayer insulating film, 313: pixel electrode
314: third wiring 300: glass substrate, 301: first wiring
302: dielectric, 303: second wiring
304: insulating film, 305: source region
306: drain region, 307: gate insulating film
308: gate wiring
309: first interlayer insulating film (silicon oxide)
310: drain wiring, 311: source wiring
312: second interlayer insulating film, 313: pixel electrode
314: third wiring

ACTIVE MATRIX DISPLAY DEVICE

BACKGROUND OF THE INVENTION

1. Field of the Invention

The present invention relates to an active matrix display device in which thin-film transistors (hereinafter, referred to as TFTs) are provided as switching elements, and more particularly, relates to a structure of a storage capacitor in each pixel of the active matrix display device.

2. Description of the Related Art

As one type of active matrix display devices, a TFT-driving liquid crystal display device is conventionally known. The TFT-driving liquid crystal display device is widely used for OA equipment, televisions and the like because a clear image can be obtained by controlling the application of a voltage to liquid crystal for each pixel with the TFTs formed on a transparent substrate such as a glass substrate. In order to realize clearer display of characters or geometric patterns, it is required to enhance definition by reducing the size of each pixel.

FIG. 1 is an equivalent circuit diagram for one pixel of a TFT-driving liquid crystal display device. A TFT 102 is disposed at the intersection of a gate signal line 100 and a source signal line 101. A storage capacitor 104 is connected to the TFT 102 as a load of the TFT 102 in parallel with a liquid crystal capacitor 103. With this configuration, when the TFT 102 is switched ON based on a signal of the gate signal line 100, the electric potential of the source signal line 101 is written to a pixel electrode portion 105, thereby accumulating electric charges in the liquid crystal capacitor 103 and the storage capacitor 104. When the TFT 102 is switched OFF, only the electric charges accumulated in the liquid crystal capacitor 103 are stored. By disposing the storage capacitor 104 in parallel with the liquid crystal capacitor 103 as shown, however, a storage property can be improved.

The storage capacitor 104 has a function of restricting a shift in the voltage of a display electrode occurring on the operation of the TFT 102. Namely, in the overlapping portion between the gate signal line 100 and the source signal line 101, a change in a parasitic capacitor 107 occurs in accordance with the ON/OFF operation of the TFT 102. Accordingly, the storage capacitor 104 is disposed in parallel with the liquid crystal capacitor 103 to increase the total amount of capacitance, thereby reducing the effects of direct-current components on the electric potential of the pixel electrode portion 105 due to the parasitic capacitor 107.

For the above advantage, the storage capacitor 104 is considered as an essential circuit component for the pixel of the TFT-driving liquid crystal display device.

FIG. 2 shows an exemplary conventional storage capacitor. An active layer 201 formed on a glass substrate 200 and a capacitor wiring 203 formed of the same film as that of a gate wiring, each serving as an electrode, interpose therebetween a dielectric 202 formed of the same film as that of a gate insulating film to form the storage capacitor. This structure is advantageous in that a highly reliable and high-quality storage capacitor can be formed even at a small thickness by using the gate insulating film as the dielectric 202.

However, the amount of the storage capacitor required for one pixel is determined based on the ratio of a channel width to a channel length of the TFT serving as a switching element, the amount of the parasitic capacitor and the like. Then, the area of the capacitor element is determined from a capacitor value for a unit area of the dielectric. Therefore, a necessary capacitor value is substantially satisfied by controlling the area of the dielectric 202 in accordance with a necessary capacitor value.

In general, the storage capacitor is conventionally formed outside the pixel TFT area, that is, in the display area. Therefore, the area occupied by the capacitor element for sufficiently reserving the capacitor value increases in the pixel area to adversely decrease an aperture ratio of the pixel, a light transmittance, and the contrast. As a result, there arises a problem that a clear screen display cannot be obtained. In particular, when it is desired to realize a high-definition display device, this drawback becomes noticeable.

The first object of the present invention is to obtain the structure of a capacitor element which allows a sufficient amount of the storage capacitance to be reserved even when the area for one pixel is reduced in order to realize high definition of the active matrix display device.

The second object of the present invention is to improve the display retention property of each pixel without decreasing the aperture ratio in the active matrix display device.

The third object of the present invention is to obtain the structure of a capacitor element with high reliability in the active matrix display device.

By achieving the above first, second, and third objects, the present invention achieves another object of fabricating a display device with a high aperture ratio and a sufficient amount of the storage capacitance.

Furthermore, the present invention has the object to improve a throughput and reliability of a display device (typically, a liquid crystal display device or an electro luminescence (EL) display device) in which TFTs are integrated on the same substrate. On the other hand, the present invention has a further object to improve the reliability of electric appliances that utilize the display devices fabricated by using the present invention.

SUMMARY OF THE INVENTION

In order to achieve the above first object, first it is necessary not to form a capacitor element in the display area which affects the aperture ratio. Therefore, the inventor of the present invention conceives to form the capacitor element in the pixel TFT area. Furthermore, in order to obtain a sufficient amount of the storage capacitance without increasing the pixel TFT area, the object can be achieved by disposing the capacitor element below the pixel TFT area as shown in FIG. 3.

In order to achieve the above second object, in addition to meeting the above first requirement, one or more storage capacitors may be provided. FIG. 4 shows an example where two storage capacitors using a first wiring 301, a second wiring 303, and a third wiring 314 are provided below the pixel TFT area. With this structure, a sufficient area can be reserved even when the area for each pixel is reduced to achieve the display with high definition. As a result, a good storage property can be obtained.

In order to achieve the above third object, in addition to meeting the first and second requirements, it is necessary to dispose the capacitor element below the pixel TFT area. By disposing the capacitor element below the pixel TFT area, a highly reliable film can be obtained because a sufficient thermal treatment for improving the film quality can be conducted on the dielectric.

Moreover, by using a material having a light-shielding property for the capacitor wirings, the deterioration of the active layer (semiconductor film) due to incident light can be reduced.

DETAILED DESCRIPTION OF THE PREFERRED EMBODIMENTS

Figure 1:
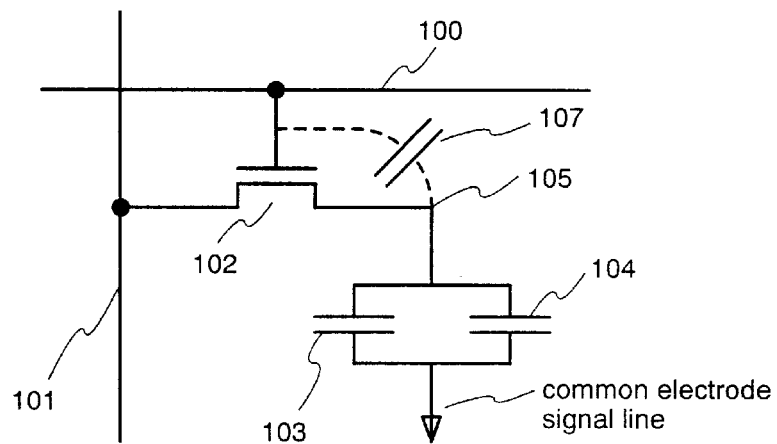
FIG. 1 is a diagram showing an equivalent circuit for one pixel of a liquid crystal display device.
Figure 2:
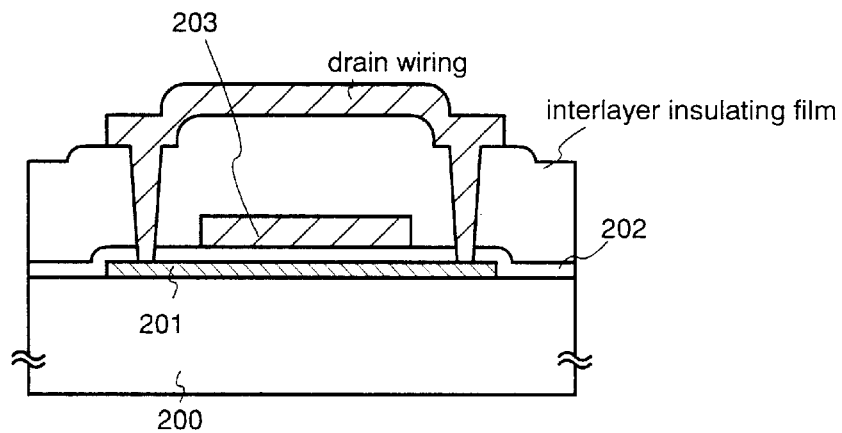
FIG. 2 is a cross-sectional view showing the structure of a conventional storage capacitor.
Figure 3:
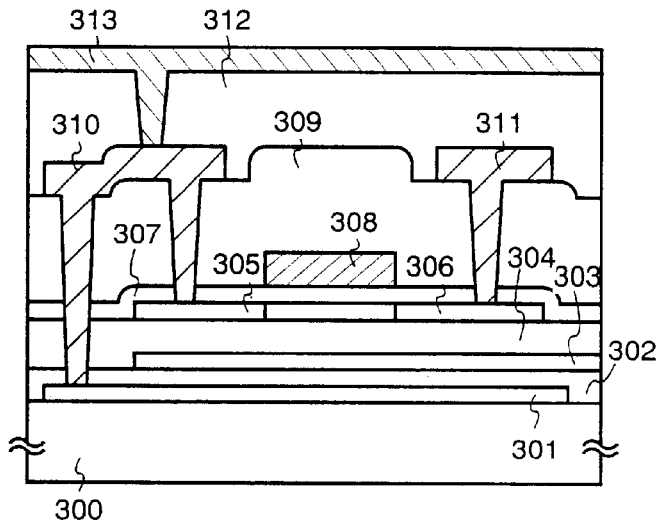
FIG. 3 is a diagram showing the structure of a storage capacitor according to the present invention.
Figure 4:
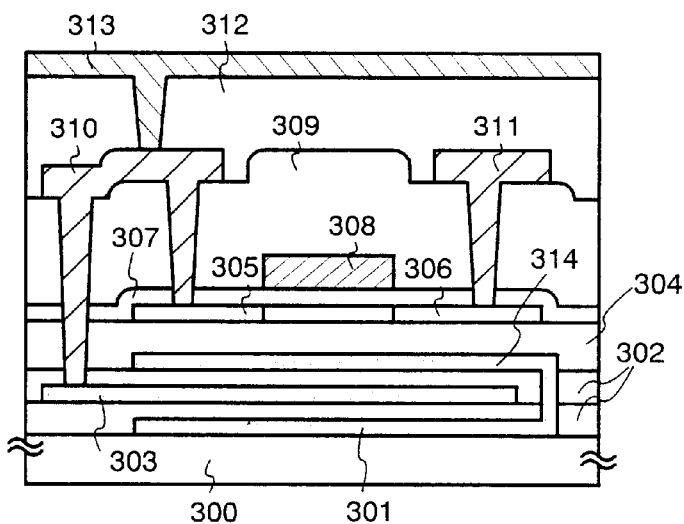
FIG. 4 is a diagram showing the structure of a storage capacitor according to the present invention.
Figure 5:
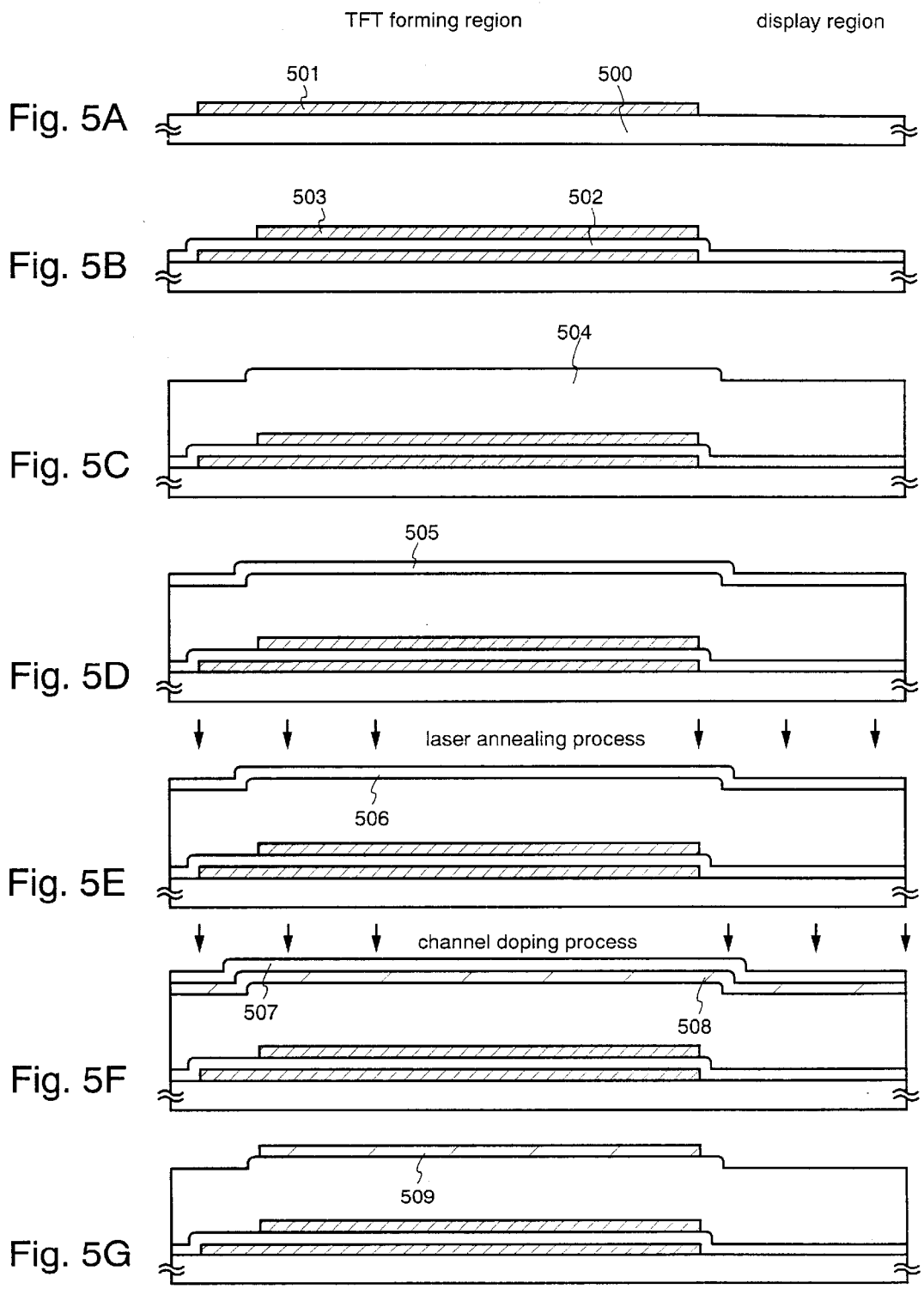
FIGS. 5A to 5G are diagrams showing the fabrication steps of a pixel area according to Embodiment 1 of the present invention.
Figure 6:
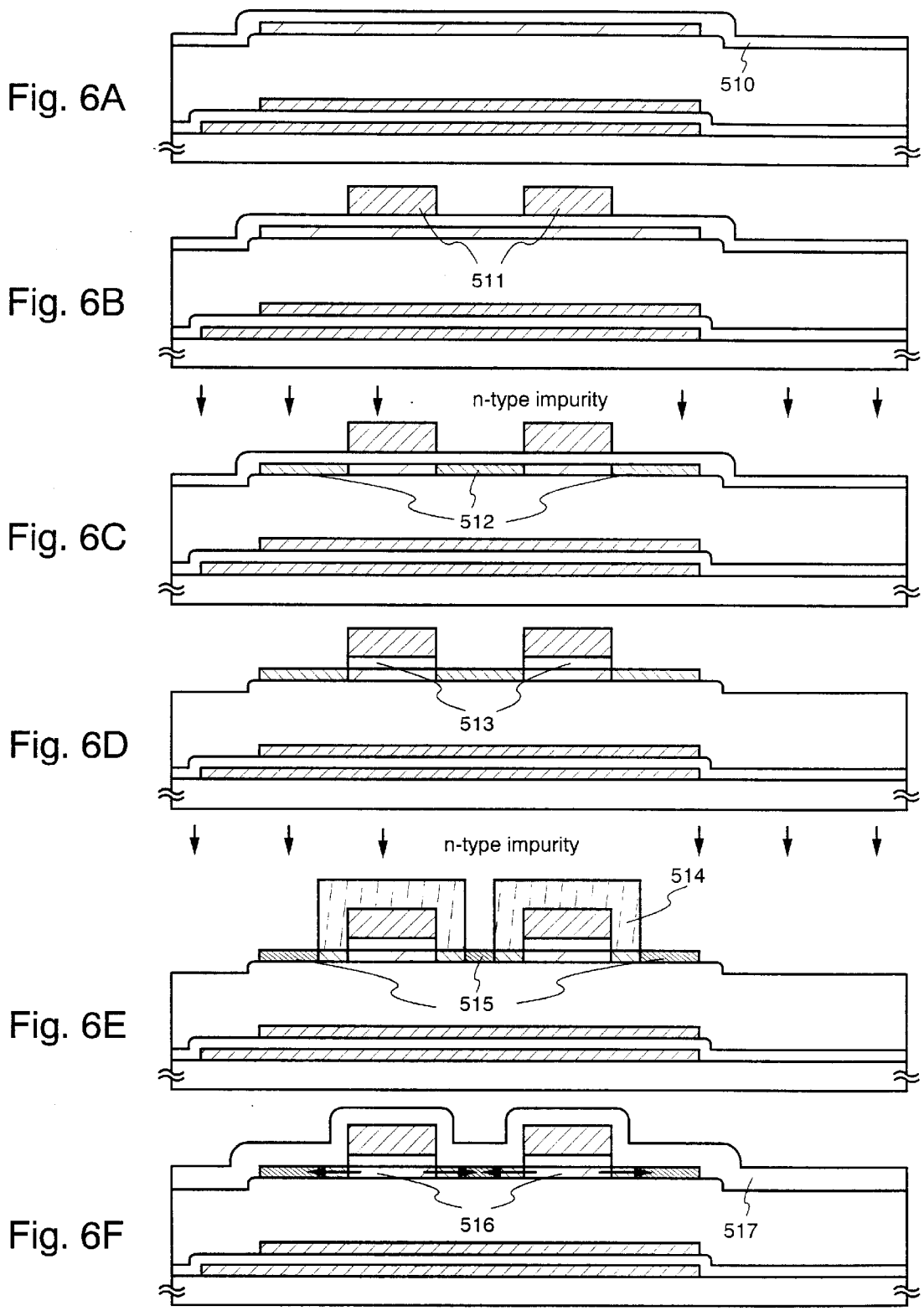
FIGS. 6A to 6F are diagrams showing the fabrication steps of the pixel area according to Embodiment 1 of the present invention.
Figure 7:
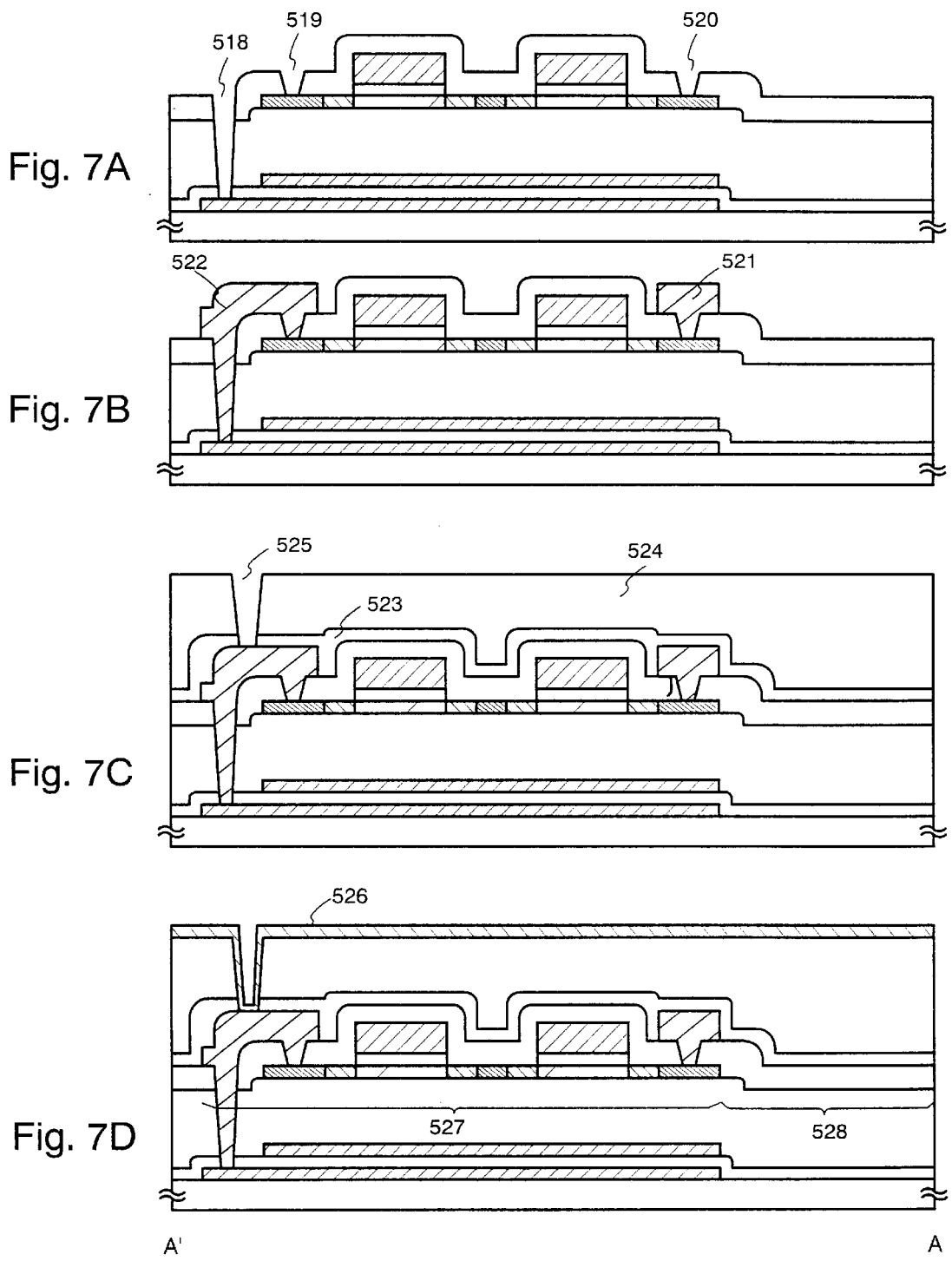
FIGS. 7A to 7D are diagrams showing the fabrication steps of the pixel area according to Embodiment 1 of the present invention.

An explanation of fabricating processes of a display device (a liquid crystal display device or an EL display device) in which the present invention of disposing the storage element below the pixel TFT area is used are provided by using figures.

Embodiment 1

The embodiments of the present invention will be described with reference to FIGS. 5A to 7D. Hereinafter, a method of fabricating an active matrix substrate, in particular, a method of fabricating a pixel area will be described. The pixel area consists of a pixel TFT area which is a TFT provided for a pixel and a display area excluding the TFT area.

In FIG. 5A, a glass substrate or a quartz substrate can be used as a substrate 500. Besides these substrates, a silicon substrate, a metal substrate or a stainless substrate, on which an insulating film is formed on the surface, may be used as the substrate 500. It is also possible to use a plastic substrate having a sufficient thermal resistance. Then, in the region where a pixel TFT area is to be formed later, a tantalum film is formed at a thickness of 200 nm in an island pattern as a first capacitor wiring 501.

Next, a dielectric 502 is formed on the first capacitor wiring 501. In this embodiment, a silicon oxynitride film at the thickness ranging from 100 to 200 nm is used as the dielectric 502. As the dielectric, an oxide film or a nitride film containing silicon can be alternatively used. Then, a tantalum film at a thickness of 200 nm is formed in an island pattern as a second capacitor wiring 503 on the dielectric 502 (FIG. 5B).

Besides the tantalum film, an element selected from tantalum (Ta), titanium (Ti), molybdenum (Mo), tungsten (W), chromium (Cr) and silicon (Si), and an alloy film formed of the combination thereof (typically, an Mo—W alloy or an Mo—Ta alloy) can be used for the first and the second capacitor wirings 501 and 503.

Since the capacitor element according to the present invention underlies a pixel TFT area 527, the defect due to external damage can be restrained to the minimum. The defect due to external damage herein indicates, for example, cracks due to local pressure applied by a spacer, or the like.

Next, a silicon oxide film is formed at a thickness in the range of 500 to 900 nm as an insulating film 504 for insulating the capacitor element consisting of the capacitor wirings 501 and 503 and the dielectric 502 formed as described above, from a TFT to be formed thereabove (FIG. 5C). Successively, an amorphous semiconductor film (an amorphous silicon film in this embodiment) 505 of a thickness in the range of 20 to 100 nm is formed on the insulating film 504 by a known film-forming method. In addition to the amorphous silicon film, amorphous compound semiconductor films such as an amorphous silicon germanium film can be used as the amorphous semiconductor film.

Then, according to the technique described in Japanese Patent Application Laid-Open No. Hei 7-130652 (corresponding to U.S. Pat. No. 5,643,826), a semiconductor film containing crystal structures (a crystalline silicon film in this embodiment) 506 is formed. The technique described in the above Japanese Patent Publication concerns crystallization means utilizing a catalyst element (one or a plurality of elements selected from nickel, cobalt, germanium, tin, lead, palladium, iron, and copper; typically, nickel) which promotes crystallization, when the amorphous silicon film is to be crystallized.

Specifically, a thermal treatment is conducted with the catalyst element being held on the surface of the amorphous silicon film so as to transform the amorphous silicon film into a crystalline silicon film. Although the technique described in Embodiment 1 of the above Japanese Patent Publication is used in this embodiment, the technique described in Embodiment 2 thereof may be alternatively used. Although the crystalline silicon film includes a single-crystalline silicon film and a polycrystalline silicon film, the crystalline silicon film formed in this embodiment is a silicon film including crystal grain boundaries.

It is desirable that the amorphous silicon film is subjected to a dehydrogenation treatment through heating preferably at 400 to 550° C. for a few hours to reduce the amount of contained hydrogen to 5 atom % or less so as to perform the successive steps of crystallization, although these values depend on the amount of contained hydrogen in the amorphous silicon film. The amorphous silicon film may be formed by another fabrication method such as sputtering or vapor deposition. However, in such a case, it is desirable to reduce an impurity element such as oxygen, nitrogen or the like contained in the film to an allowable level.

Next, a known technique is used for the amorphous silicon film 505 to form a crystalline silicon film (a polysilicon film or a polycrystalline silicon film) 506 (FIG. 5E). In this embodiment, light emitted from a laser (a laser beam) is irradiated on the amorphous silicon film 505 to form the crystalline silicon film 506. A pulse oscillating or a continuous-wave excimer laser can be used as a laser. In addition to these excimer lasers, a continuous-wave argon laser may be used. Alternatively, a second harmonic wave, a third harmonic wave, and a fourth harmonic wave emitted from an Nd:YAG laser or an Nd:YVO$_4$ laser may be used. The beam shape of laser light may be linear (including an oblong shape) or rectangular.

Instead of laser light, light emitted from a lamp (lamp light) may be irradiated (hereinafter, referred to as lamp annealing). As lamp light, light emitted from a halogen lamp, an infrared lamp, or the like may be used.

The process for conducting a thermal treatment (annealing) using laser light or lamp light in this manner is referred to as a light annealing process. The light annealing process allows an effective thermal treatment process to be conducted with a high throughput even when a substrate with a low thermal resistance such as a glass substrate is used, because the light annealing process permits a high-temperature thermal treatment in a short period. It is obvious that furnace annealing using an electrical furnace (also referred to as thermal annealing) may be alternatively used to obtain the same result of annealing.

In this embodiment, pulse oscillating excimer laser light is processed into a linear shape to conduct the laser annealing process. The laser annealing conditions are set as follows: an XeCl gas as an excited gas; a room temperature as a treatment temperature; 30 Hz of a pulse-oscillating frequency; a laser energy density in the range of 250 to 500 mJ/cm$^2$ (typically in the range of 350 to 400 mJ/cm$^2$).

The laser annealing process conducted under the above conditions has the effects of completely crystallizing an amorphous region remaining uncrystallized after the thermal crystallization, and of reducing the defects of the previously crystallized crystalline region or the like. Therefore, this process may be referred to as a process for improving the crystallinity of the semiconductor film by light annealing or a process for promoting the crystallization of the semiconductor film. Such effects can be also obtained by optimizing the conditions of lamp annealing.

Next, a protection film 507 is formed on the crystalline silicon film 506 for successive addition of an impurity. As the protection film 507, a silicon oxynitride film or a silicon oxide film of a thickness of 100 to 200 nm (preferably 130 to 170 nm) is used. The protection film 507 serves to not directly expose the crystalline silicon film 506 to plasma on addition of an impurity, and to permit fine control of the concentration.

Successively, an impurity element for imparting a p-type property (hereinafter, referred to as a p-type impurity element) is added through the protection film 507. As the p-type impurity element, elements that are members of the 13th group of the periodic table, typically boron or gallium, may be used. This process (referred to as a channel doping process) is for controlling a threshold voltage of the TFT. In this example, boron is added by an ion doping method in which diborane (B$_2$H$_6$) is excited by plasma without conducting mass separation. It is apparent that an ion implantation method with mass separation may be used.

By this process, an impurity region 508 containing the p-type impurity element (boron in this embodiment) at a concentration in the range of $1\times10^{15}$ to $1\times10^{18}$ atoms/cm$^3$ (typically, $5\times10^{16}$ to $5\times10^{17}$ atoms/cm$^3$) is formed. In this specification, an impurity region containing the p-type impurity element at least at the concentration within the above range is defined as the p-type impurity region (b) (FIG. 5F).

Next, after removal of the protection film 507, an unnecessary portion of the crystalline silicon film is removed to form an island-pattern semiconductor film (hereinafter, referred to as an active layer) 509 (FIG. 5G).

Next, a gate insulating film 510 is formed so as to cover the active layer 509. The gate insulating film 510 may be formed to have a thickness in the range of 10 to 200 nm, preferably, in the range of 50 to 150 nm. In this embodiment, a silicon oxynitride film made of N$_2$O and SiH$_4$ as material gases by a plasma CVD method is formed to have a thickness of 115 nm (FIG. 6A).

Next, a laminate film including two layers, i.e., a tungsten nitride (WN) layer having a thickness of 50 nm and a tantalum (Ta) layer having a thickness of 350 nm, is formed as a gate wiring (electrode) 511 (FIG. 6B). Although the gate wiring may be formed of a single-layer dielectric film, it is preferred to form the gate wiring with a laminate film including two layers, three layers and the like as needed.

In this embodiment, a double gate system is adopted as shown in FIG. 6B. It is effective to utilize a multi-gate system as a countermeasure to leakage of the gate. Furthermore, the multi-gate structure is particularly adequate for placement of the capacitor element in the present invention because the pixel TFT area can be sufficiently reserved owing to this structure.

As the gate wiring, an element selected from tantalum (Ta), titanium (Ti), molybdenum (Mo), tungsten (W), chromium (Cr) and silicon (Si), or an alloy film formed of the combination thereof (typically, an Mo—W alloy or an Mo—Ta alloy) can be used.

Next, an n-type impurity element (in this embodiment, for example, phosphorus) is added in a self-aligning manner using the gate wiring (electrode) 511 as a mask. The addition of phosphorus is controlled so that the thus formed impurity region 512 has the concentration of phosphorus 5 to 10 times higher (typically, $1\times10^{16}$ to $5\times10^{18}$ atoms/cm$^3$, more typically, $3\times10^{17}$ to $3\times10^{18}$ atoms/cm$^3$) than that of boron added by the above described channel doping process. In this specification, the impurity region containing the n-type impurity element within the above concentration range is defined as an n-type impurity region (c) (FIG. 6C).

Although boron is already added to the above p-type impurity region (b) 508 at the concentration in the range of $1\times10^{15}$ to $5\times10^{18}$ atoms/cm$^3$ in the channel doping process, it may be considered that boron does not affect the function of the p-type impurity region (b) because phosphorus is added in this process at the concentration 5 to 10 times higher than that of boron contained in the p-type impurity region (b) 508.

Next, a gate insulating film 513 is etched in a self-aligning manner using the gate wiring (electrode) 511 as a mask. A dry etching method is used for etching. Although a CHF$_3$ gas is herein used as an etching gas, the etching gas is not limited thereto. In this way, the gate insulating film 513 is formed under the gate wiring (electrode) 511 (FIG. 6D).

By exposing the active layer in this manner, an accelerating voltage can be lowered when a successive process for adding an impurity element is performed. Moreover, a throughput is improved owing to a small amount of dosing needed. It is apparent that the impurity region can be formed by through doping with the gate insulating film being left unetched.

Next, a resist mask 514 is formed so as to cover the gate wiring (electrode) 511. Then, an n-type impurity element (in this embodiment, phosphorus) is added to the n-type impurity region (c) 512 to form an impurity region 515 containing phosphorus at a high concentration. The n-type impurity element is added also by an ion doping method using phosphin ($PH_3$) (it is obvious that an ion implantation method may be used instead). The impurity region 515 has a concentration of phosphorus in the range of $1\times10^{20}$ to $1\times10^{21}$ atoms/cm$^3$ (typically, in the range of $2\times10^{20}$ to $5\times10^{21}$ atoms/cm$^3$) (FIG. 6E).

In this specification, an impurity region containing an n-type impurity element in the above range of the concentration is defined as an n-type impurity region (a). Although the region where the impurity region 515 is formed contains phosphorus or boron already added in the previous process, the effects of phosphorus or boron may be neglected because phosphorus is added at a sufficiently high concentration in this process. Therefore, the impurity region 515 may also be referred to as the n-type impurity region (a) in this specification.

Next, after removal of the resist mask 514, a first interlayer insulating film 517 is formed. The first interlayer insulating film 517 may be made of an insulating film containing silicon, more specifically, a silicon nitride film, a silicon oxide film, a silicon oxynitride film, or a laminate film of the combination thereof. The thickness of the film may be set to be within the range of 600 nm to 1.5 μm. In this embodiment, a silicon oxynitride film (having a nitride concentration in the range of 25 to 50 atomic %) having a thickness of 1 μm formed by a plasma CVD method using $SiH_4$, $N_2O$ and $NH_3$ as material gases is used.

Thereafter, a thermal treatment is performed so as to activate the n-type or p-type impurity element added at the respective concentrations. This process is performed by using a furnace annealing method, a laser annealing method, or a rapid thermal annealing method (RTA method). In this embodiment, the activating process is carried out by a furnace annealing method. The thermal treatment is conducted in a nitrogen atmosphere at a temperature in the range of 300 to 650° C., preferably in the range of 400 to 550° C., 550° C. in this example, for four hours (FIG. 6F).

At this moment, the catalyst element (in this embodiment, nickel) used for crystallization of the amorphous silicon film in this embodiment moves toward the direction indicated with the arrows in the drawing to be gettered by the region 515 containing phosphorus at a high concentration formed in the above process shown in FIG. 6E. This phenomenon results from the effects of phosphorus gettering a metal element. As a result of this phenomenon, a channel forming region 516 has a concentration of the catalyst element of $1\times10^{17}$ atoms/cm$^3$ or less (preferably, $1\times10^{16}$ atoms/cm$^3$ or less).

On the contrary, a region serving as a gettering site of the catalyst element (the impurity region 515 formed by the process shown in FIG. 6E) contains the catalyst element at a high concentration of $5\times10^{18}$ atoms/cm$^3$ or less (typically, $1\times10^{19}$ to $5\times10^{20}$ atoms/cm$^3$) due to segregation of the catalyst element.

Furthermore, in the atmosphere containing hydrogen in the range of 3 to 100%, a thermal treatment at 300 to 450° C. is conducted for 1 to 12 hours so as to perform a process for hydrogenating the active layer. This process is for terminating a dangling bond in the semiconductor layer with thermally excited hydrogen. In order to hydrogenate the active layer, plasma hydrogenation (using hydrogen excited by plasma) may be conducted instead.

Then, after the formation of through holes 518 to 520 reaching the first capacitor wiring 501, the source region and the drain region of the TFT (FIG. 7A), a source wiring 521 and a drain wiring 522 are formed (FIG. 7B). Although the drain wiring 522 is formed to have such a structure that the drain wiring 522 is conductive with the first capacitor wiring 501, the drain region and the pixel electrode in this embodiment, the structure of the drain wiring 522 is not limited thereto. Another example of the structure will be shown in Embodiment 3. Moreover, although not shown, a Ti film having a thickness of 100 nm, an aluminum film containing Ti having a thickness of 300 nm, and a Ti film having a thickness of 150 nm are successively formed by sputtering so as to form the drain wiring 522 as a three-layered laminate film.

Next, a silicon nitride film, a silicon oxide film, or a silicon oxynitride film is formed to have a thickness of 50 to 500 nm (typically, 200 to 300 nm) as a passivation film 523. In this embodiment, prior to the formation of the film, a plasma treatment is conducted using a gas containing hydrogen such as $H_2$ or $NH_3$. After the formation of the film, a thermal treatment is conducted. Hydrogen excited by this pre-treatment is supplied to the first interlayer insulating film. By conducting the thermal treatment under such a condition, the quality of the passivation film 523 is improved while the active layer can be effectively hydrogenated, owing to the downward diffusion of hydrogen added to the first interlayer insulating film (FIG. 7C).

Another hydrogenation process may be conducted after the formation of the passivation film 523. For example, a thermal treatment is conducted at 300 to 450° C. for 1 to 12 hours in the atmosphere containing hydrogen at 3 to 100%. Alternatively, similar effects can be obtained by using plasma hydrogenation. An aperture may be formed in the passivation film 523 at the position where a through hole for connecting the pixel electrode with the drain wiring is to be subsequently formed.

Then, a second interlayer insulating film 524 made of an organic resin is formed to a thickness of about 1 μm. As the organic resin, polyimide, acrylic, polyamide, polyimide amide, BCB (benzocyclobutene) and the like can be used. The advantage of using the organic resin film is in that a method of forming a film is simple, the amount of a parasitic capacitor can be reduced for its low relative dielectric constant, good flatness can be obtained, and the like. Besides the above organic resin films, other organic resin films or organic type SiO compounds may also be used. In this embodiment, polyimide which thermally polymerizes after application onto the substrate is used as the organic resin film. Then, the polyimide film is baked at 300° C. to complete the formation of the film.

Next, a through hole 525 reaching the drain wiring 522 is formed through the second interlayer insulating film 524 and the passivation film 523 to form a pixel electrode 526. A transparent conductive film is used for the pixel electrode 526 in the case where a transmissive liquid crystal display device is to be formed while a metal film may be used in the case where a reflective liquid crystal display device is to be formed. Since a transmissive liquid crystal display device is to be obtained in this embodiment, an oxide conductive film made of a compound of indium oxide and tin oxide (ITO film) is formed to a thickness of 110 nm by sputtering.

Figure 15:
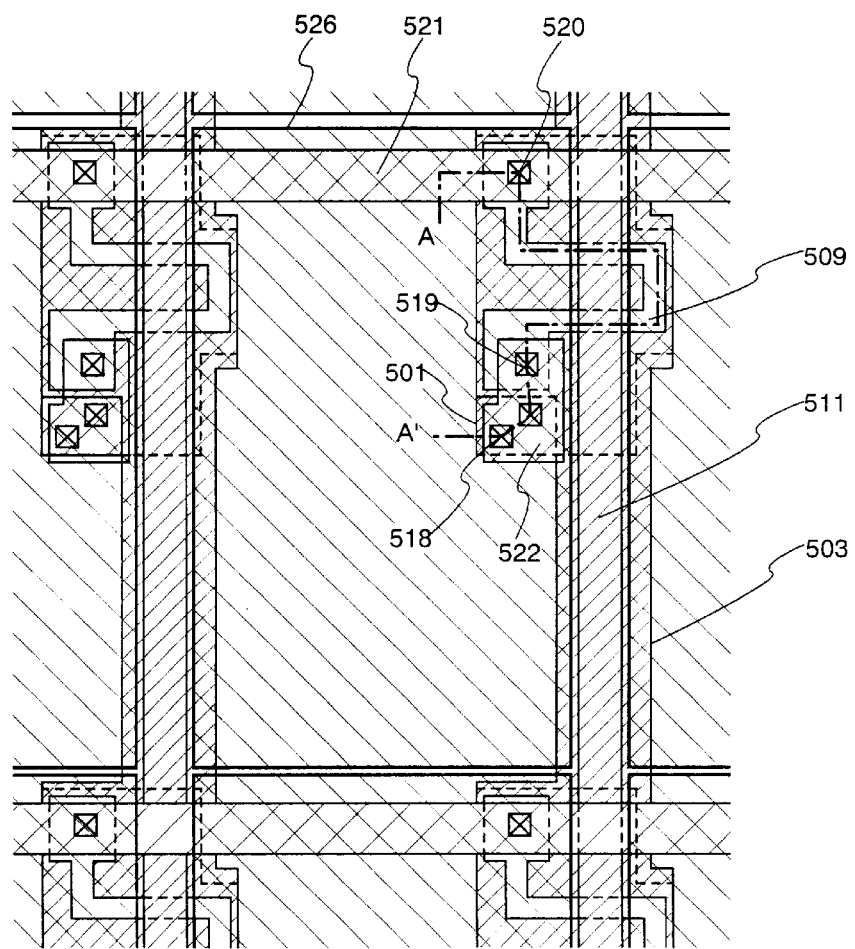
FIG. 15 is a top view of the pixel area.

In this manner, a pixel TFT area 527 including the n-channel TFT is formed in the pixel region without reducing the display area 528, i.e., the aperture ratio, thereby obtaining a sufficient amount of the storage capacitor. Moreover, by using a material having a light-shielding property for the capacitor wiring, the deterioration of the active layer due to incident light can be diminished. (FIG. 7D). A–A' in FIG. 15 corresponds to a cross-sectional view of A–A' in FIG. 7D.

Embodiment 2

Figure 8:
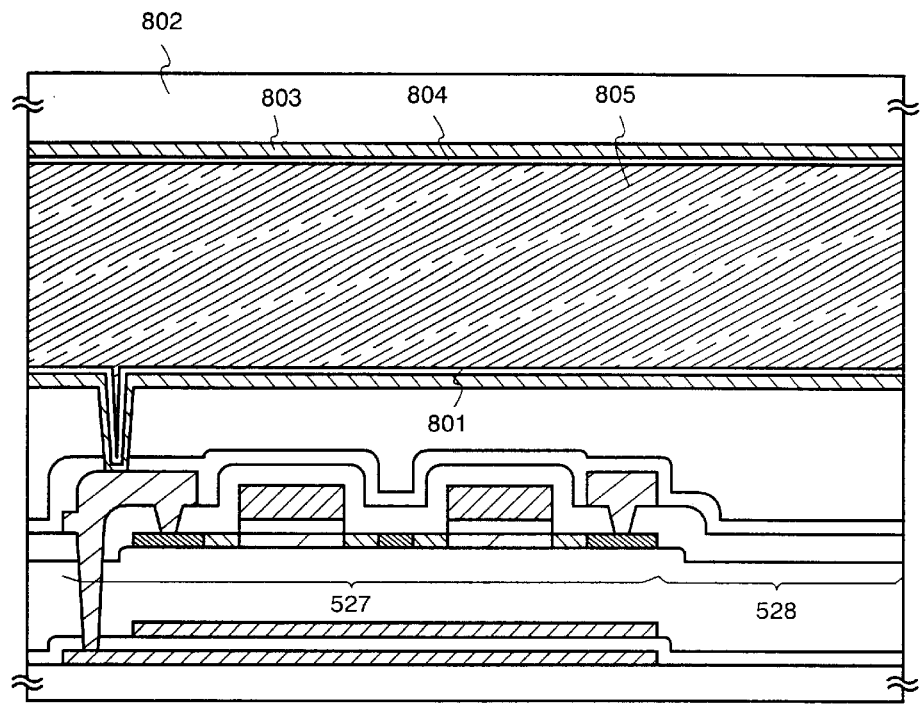
FIG. 8 is a cross-sectional view showing an active matrix liquid crystal display device.

In this embodiment, the step of fabricating an active matrix type liquid crystal display device from the active matrix substrate fabricated in Embodiment 1 will be explained. As shown in FIG. 8, an alignment film 801 is formed on the substrate in the state shown in FIG. 7D. In this Embodiment, as the alignment film, a polyimide film is used. Further, a transparent conductive film 803 and an alignment film 804 are formed on an opposite substrate 802. Further, on the opposite substrate, a color filter and a screening film may be formed as required.

Next, after the formation of the alignment film, a rubbing treatment is conducted so that the liquid crystal molecules might be oriented with a fixed pre-tilt angle. Then the active matrix substrate on which the pixel portion and the driving circuits are formed and the opposite substrate are mated together through a sealing material and a spacer (neither of them is shown) by a known cell assembling step. Thereafter, a liquid crystal 805 is injected between the two substrates and perfectly sealed by a sealing material (not shown). As the liquid crystal, a known liquid crystal material may be used. In this way, the active matrix type liquid crystal display device shown in FIG. 8 is completed.

Figure 9:
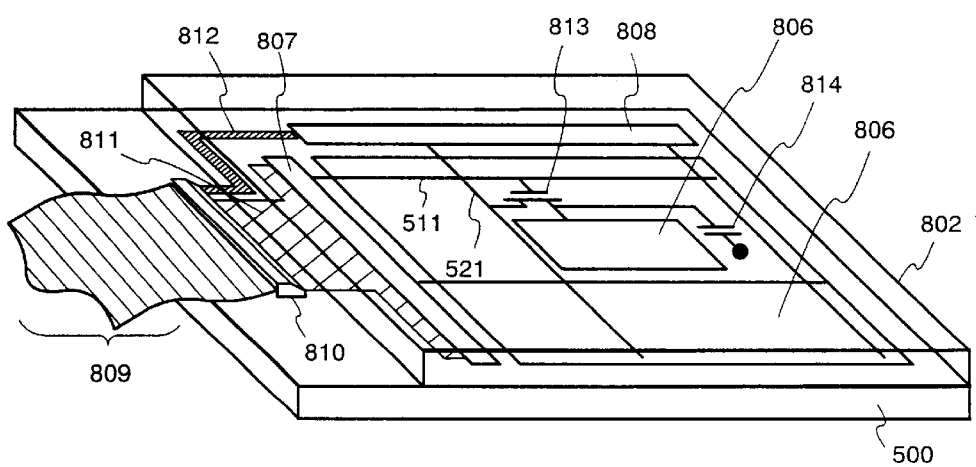
FIG. 9 is a perspective view showing the active matrix liquid crystal display device.

Next, the constitution of this active matrix type liquid crystal display device will be described referring to the perspective view shown in FIG. 9. In FIG. 9, the reference numerals common to those used in FIGS. 5A to 8 are used for associating FIG. 9 with the structural sectional views shown in FIGS. 5A to 8. The active matrix substrate is formed of a pixel portion 806, a gate signal driving circuit 807, an image (source) signal driving circuit 808 which are formed on the glass substrate 500. The pixel TFT region 813 is an n-channel type TFT, and the driving circuits provided therearound are formed on the basis of a CMOS circuit. The gate signal driving circuit 807 and the image signal driving circuit 808 are connected to the pixel portion 806 through the gate wiring (electrode) 511 and the source wiring 521, respectively. Further, an external input/output terminal 810 to which an FPC 809 is connected and the driving circuits are connected by interconnection wirings 811 and 812.

Embodiment 3

In this embodiment, the case where a pixel TFT having a different structure from that of Embodiment 1 will be described with reference to FIGS. 10A to 10E. Since only a part of fabrication steps are different from those of Embodiment 1, the same fabrication steps are designated by the same reference numerals.

In accordance with the process of Embodiment 1, the fabrication steps until the formation of the insulating film 504 are conducted. A through hole (aperture) 1001 to be connected to the first capacitor wiring 501 is formed in the insulating film 504 by etching (FIG. 10A).

Figure 10:
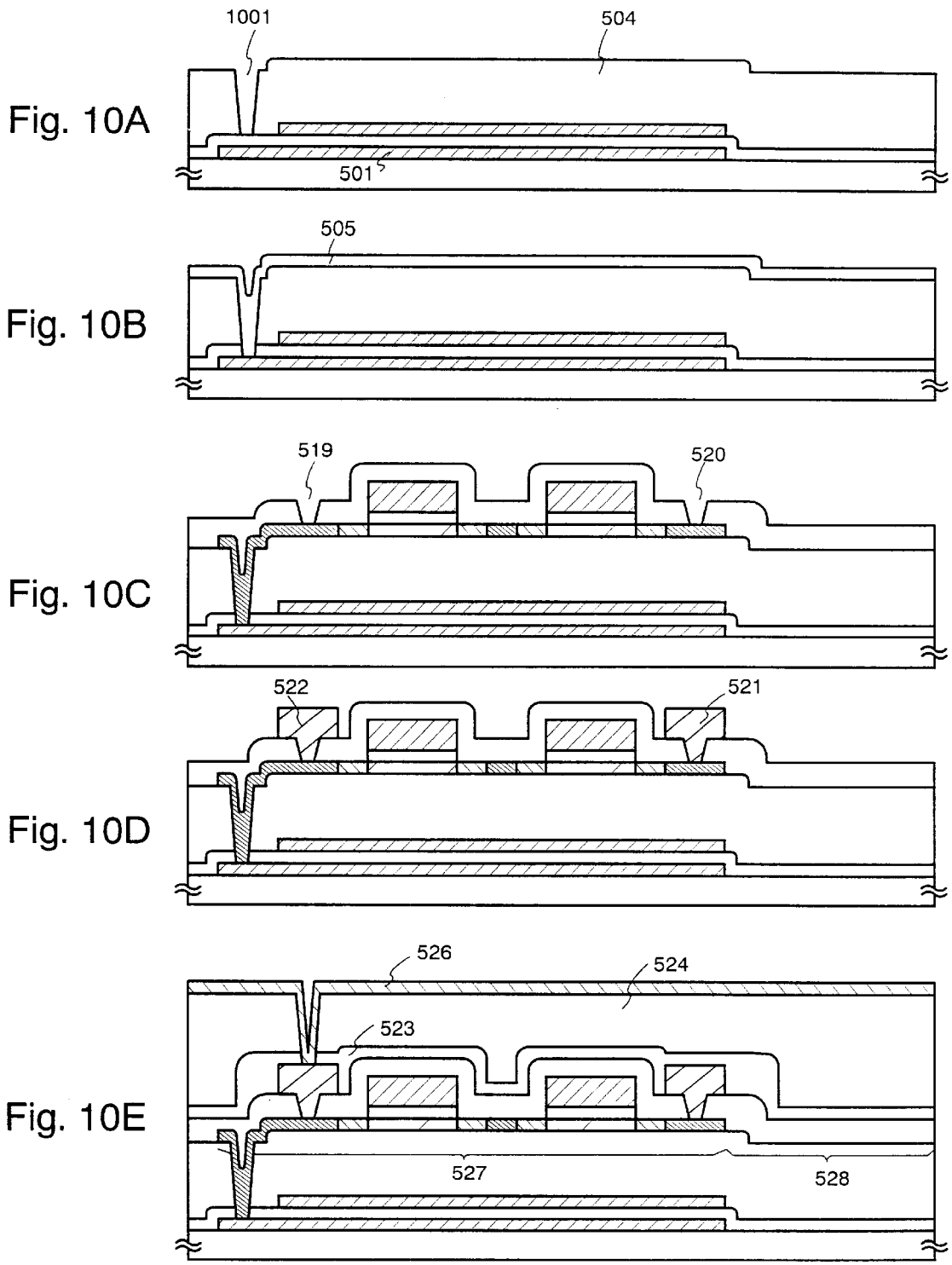
FIGS. 10A to 10E are diagrams showing the fabrication steps of a pixel area according to Embodiment 3 of the present invention.

Next, the amorphous semiconductor film (an amorphous silicon film in this embodiment) 505 is formed to a thickness of 20 to 100 nm on the insulating film 504 by a known film formation method (FIG. 10B). Besides the amorphous silicon film, an amorphous compound semiconductor film such as an amorphous silicon germanium film may be used as the amorphous semiconductor film.

This embodiment is characterized in that the wiring to be connected to the first storage wiring 501 is made of crystalline silicon. Although the through hole reaching the first capacitor wiring 501 should be simultaneously formed when forming the through hole reaching the source region and the drain region in Embodiment 1, these through holes are separately formed in this embodiment to more facilitate the etching process.

As the successive steps, the steps of Embodiment 1 shown in the drawings from FIG. 5D may be conducted. The structure in this embodiment can be applied to the fabrication of an active matrix liquid crystal display device of Embodiment 2.

Embodiment 4

An example of fabricating an EL (Electroluminecence) display using the present invention will be explained in embodiment 4. Note that FIG. 11 is a top view of an EL display device using the present invention, and FIG. 12 is a cross sectional view thereof.

Figure 11:
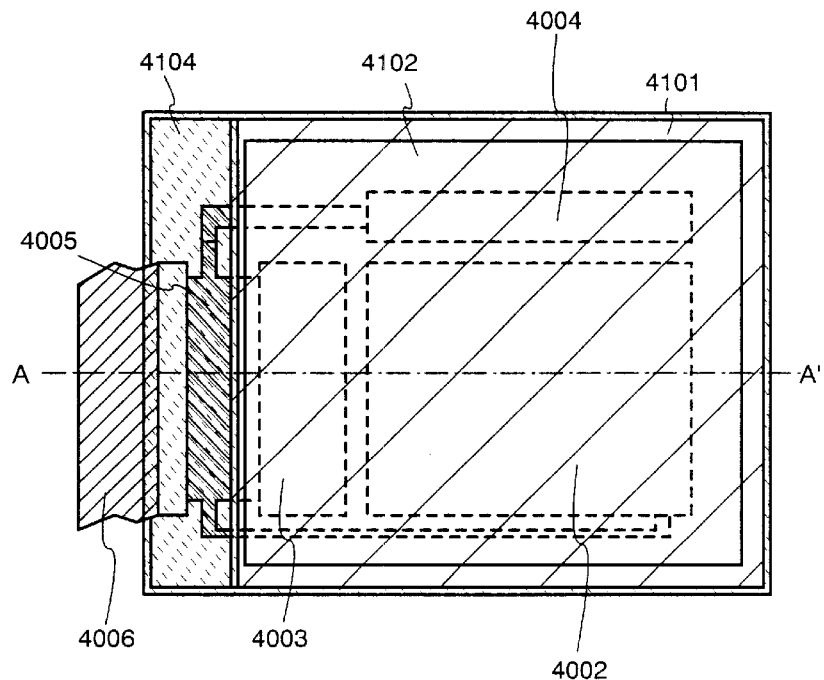
FIG. 11 is a diagram showing the structure of an active matrix EL display device.
Figure 12:
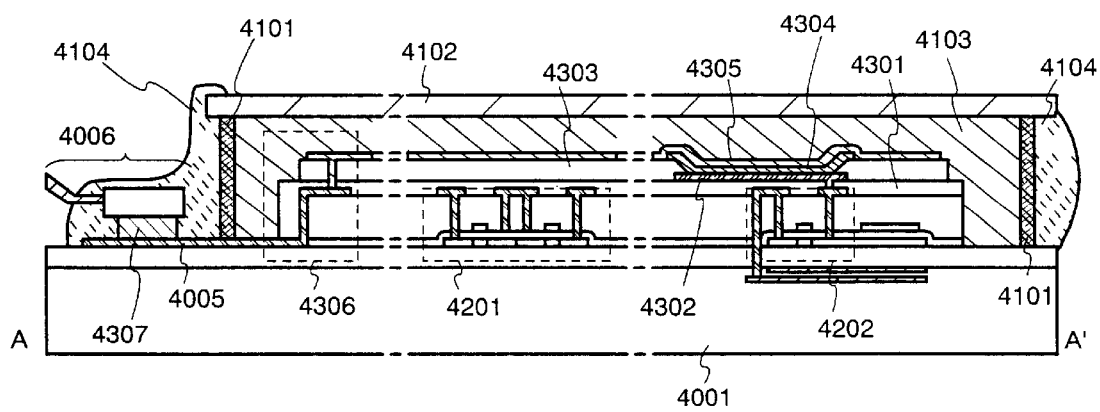
FIG. 12 is a diagram showing the structure of an active matrix EL display device.

In FIG. 11 and FIG. 12, reference numeral 4001 denotes a substrate, 4002 denotes a pixel portion, 4003 denotes a source side driving circuit, 4004 denotes a gate side driving circuit. The driving circuits are connected to external equipment, through an FPC (flexible printed circuit) 4006 via a wiring 4005.

At this time, a first sealing material 4101, a covering material 4102, a filer material 4103 and a second sealing material 4104 are provided so as to enclose the pixel portion 4002, source side driving circuit 4003, and gate side driving circuit 4004.

A cross sectional diagram of FIG. 11 cut along the line A–A' is shown in FIG. 12. On the substrate 4001, a driver TFT 4201 included in the source side driving circuit 4003 (an n-channel TFT and a p-channel TFT are shown here) and a pixel TFT 4202 included in the pixel portion 4002 (a TFT for controlling the current flowing to an EL element is shown here) are formed.

In this embodiment, the pixel TFT 4202 is fabricated using capacitor element structure of the present invention. Namely, TFTs having the same structure as that of the pixel portion in FIG. 7D are used for the pixel TFT 4202.

An interlayer insulating film (leveling film) 4301 made from a resin material is formed on the driver TFT 4201 and the pixel TFT 4202, and a pixel electrode (anode) 4302 electrically connected to a drain of the pixel TFT 4202 thereon. The pixel electrode 4302 is formed from a transparent conductive film having large work function. As the transparent conductive film, an indium oxide and tin oxide compound or an indium oxide and zinc oxide compound can be utilized.

Then, an insulating film 4303 is formed on the pixel electrode 4302, and an opening portion is formed on the pixel electrode 4302. At the opening portion, an EL layer 4304 is formed on the pixel electrode 4302. A known organic EL material or inorganic EL material is used as the EL layer 4304. Both of low molecular type (monomer based) organic EL materials and high molecular type (polymer based) organic EL materials can be used as the organic materials. The EL (electro-luminescent) display device referred to in this specification include triplet-based light emission devices and/or singlet-based light emission devices, for example.

A known technique may be used to form the EL layer 4304. The EL layer may have a lamination structure by freely combining a hole injecting layer, a hole transporting layer, a light emitting layer, an electron transporting layer, and an electron injecting layer, or a single layer structure.

On the EL layer 4304, a cathode 4305 made of a conductive film having a light-shielding property (typically, a conductive film comprising aluminum, cupper, or silver as a main component, or a lamination film of those and other conductive film) is formed. It is preferable to remove as much as possible any moisture or oxygen existing in the interface between the cathode 4305 and the EL layer 4304. It is therefore necessary to use a method of depositing continuously the cathode 4305 and the EL layer 4304 in vacuum or depositing the EL layer 4304 in an atmosphere of nitrogen or in a rare gas atmosphere, thereby a cathode 4305 is formed without exposing to oxygen and moisture. The above film deposition becomes possible in embodiment 4 by using a multi-chamber method (cluster tool method) film deposition apparatus.

Then, the cathode 4305 is electrically connected to the wiring 4005 in the region denoted by reference numeral 4306. The wiring 4005 for imparting a predetermined voltage to the cathode 4305 is connected to the FPC 4006 through a conducting material 4307.

As mentioned above, an EL element is made from the pixel electrode (anode) 4302, the EL layer 4304 and the cathode 4305. The EL element is enclosed with a covering material 4102 which is laminated with the substrate 4001 through a first sealing material 4101 and a first sealing material 4101, and sealed with a filer material 4103.

Materials such as a glass plate, a metal plate (typically, a stainless steel plate), a ceramic plate, an FRP (fiberglass-reinforced plastic) plate, a PVF (polyvinyl fluoride) film, a Mylar film, a polyester film, and an acrylic film can be used as the covering material 4102. It is preferable to use a sheet structure in which aluminum foil is sandwiched by a PVF film or a Mylar film.

Note that, for a case in which the emission direction of light emitted from the EL element is directed to the covering material side, it is necessary for the covering material to possess transparency. In the case, a transparent material such as a glass plate, a plastic plate, a polyester film or an acrylic film can be used.

Additionally, a filler material 4103 is formed using ultraviolet curing resin or thermally curable resin. PVC (polyvinyl chloride), acrylic, polyimide, epoxy resin, silicone resin, PVB (polyvinyl butyral), and EVA (ethylene vinyl acetate) can be used as the filler material. If a drying agent (preferably, barium oxide) is formed on the inside of the filler material 4103, then it can suppress the degradation of the EL element.

Further, spacer may be contained in the filler material 4103. At this time, the spacer is formed by using barium oxide, thereby the spacer itself has a hygroscopic property. Further, in the case of providing the spacer, it is effective that a resin film is provided on the anode 4305 as a buffer layer for relaxation of pressure from the spacer.

Further, the wiring 4005 is electrically connected to the FPC 4006 via the conductive material 4305. The wiring 4005 transmits signals forwarding the pixel portion 4002, source side driving circuit 4003 and gate side driving circuit 4004 to the FPC 4006 and are electrically connected to external equipment through the FPC 4006.

Also, in the present embodiment, a second sealing material 4104 is provided to cover an exposure portion of the first sealing material 4101 and portion of the FPC 4006 to obtain the structure in which the EL element is completely shut out from the outside. In this way, the EL display device has a cross sectional structure shown in FIG. 12. Note that the EL display device of embodiment 4 may be fabricated by combining it with the constitution of Embodiment 1.

Embodiment 5

In this embodiment, the case where a pixel TFT having a different structure from that of Embodiment 1 will be described with reference to FIG. 13. Since only a part of fabrication steps are different from those of Embodiment 1, the same steps are designated by the same reference numerals.

Figure 13A:
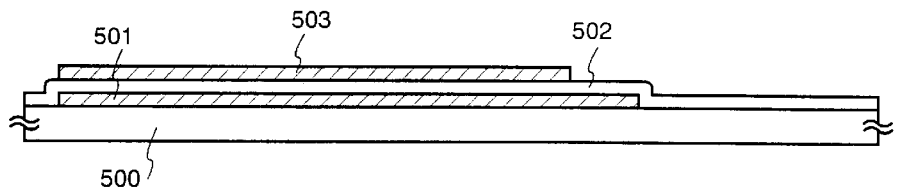
FIGS. 13A to 13E are diagrams showing the fabrication steps of a pixel area according to Embodiment 5 of the present invention.
Figure 13B:
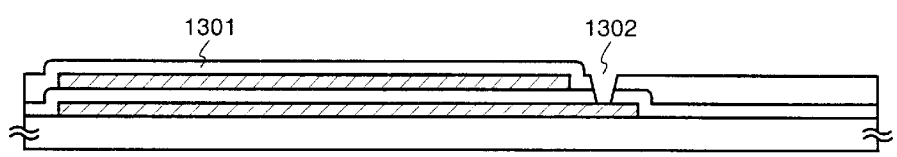

According to the fabrication process of Embodiment 1, the fabrication steps until the formation of the second capacitor wiring 503 are conducted (FIG. 13A). Then, a second dielectric 1301 is formed on the second capacitor wiring 503, and a through hole (aperture) 1302 reaching the first capacitor wiring 501 is formed by etching (FIG. 13B). In this embodiment, a silicon oxynitride film having a thickness of 100 to 200 nm is used as the second dielectric 1301.

Figure 13C:
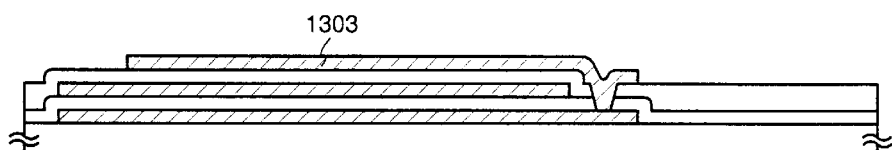
Figure 13D:
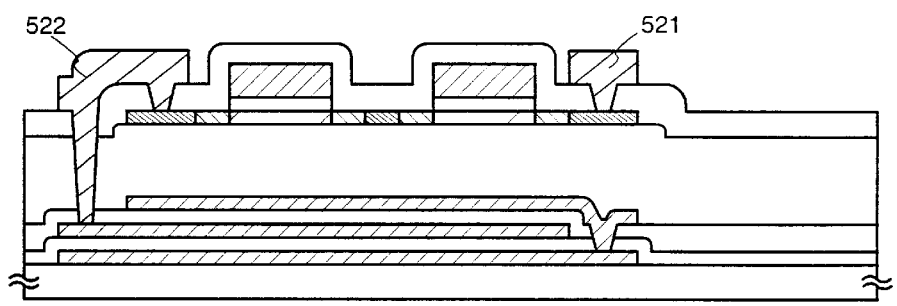

Next, a third capacitor wiring 1303 is formed on the second dielectric 1301. With this structure, the third capacitor wiring 1303 is electrically connected to the first capacitor wiring 501. In this example, an element selected from tantalum (Ta), titanium (Ti), molybdenum (Mo), tungsten (W), chromium (Cr) and silicon (Si) or an alloy film formed of the combination thereof (typically, an Mo—W alloy or an Mo—Ta alloy) can be used as the third capacitor wiring 1303 (FIG. 13C).

As the successive steps, the steps of Embodiment 1 shown in the drawings from FIG. 5D onwards may be conducted. In this embodiment, however, the drain wiring 522 is connected to the second capacitor wiring 503.

Figure 13E:
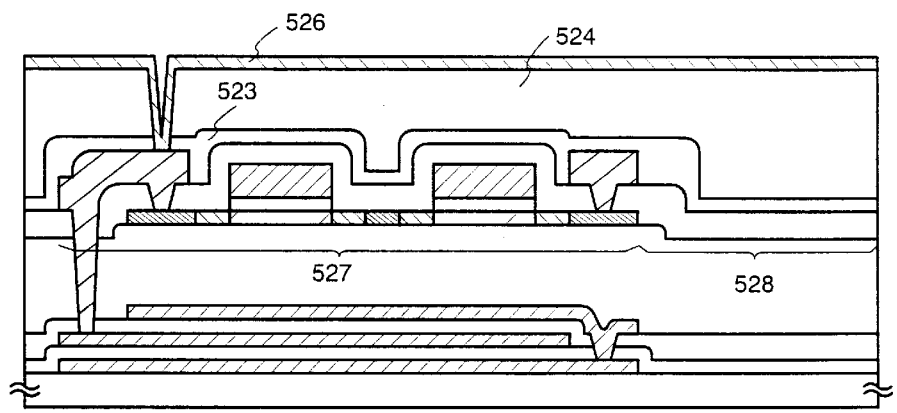

In this embodiment, two storage capacitors electrically parallel to each other are formed between the pixel TFT area 527 and the substrate 500 (FIG. 13E). The first storage capacitor includes the first dielectric 502, and the first capacitor wiring 501 and the second capacitor wiring 503 interposing the first dielectric 502 therebetween. The second storage capacitor includes the second dielectric 1301, and the second capacitor wiring 503 and the third capacitor wiring 1303 interposing the second dielectric 1301 therebetween. Namely, the second capacitor wiring 503 connected to the pixel TFT serves as a common wiring for the first storage capacitor and the second storage capacitor.

By disposing two or more storage capacitors electrically parallel to each other in this way, a larger amount of storage capacitance can be obtained. Therefore, a sufficient amount of storage capacitance can be obtained without degrading the aperture ratio even if the area for one pixel is reduced for achieving higher definition of the display. Moreover, the structure of this embodiment can be applied to the fabrication of an active matrix liquid crystal display device of Embodiment 2.

Embodiment 6

The electronic device of the present invention can be used as a display portion of electronic equipments. Following can be given as such electronic equipment: video cameras; digital cameras; projectors; projection TV, goggle type displays (head mounted displays); car navigation systems; audio reproducing devices; notebook personal computers;

game equipments; portable information terminals (such as mobile computers, portable telephones, mobile game equipments or electronic books); and an image playback device provided with a recording medium. Examples of these are shown in FIGS. 14A to 14F.

Figure 14A:
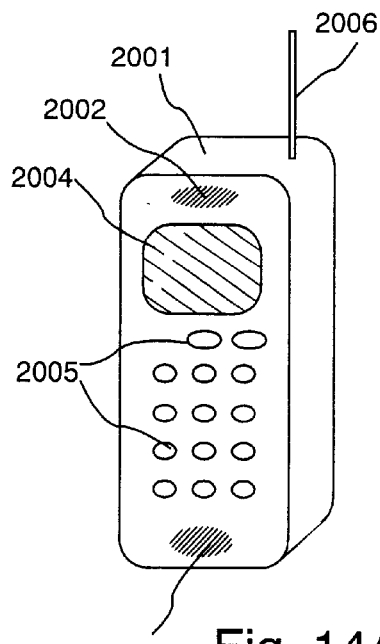
FIGS. 14A to 14F are diagrams showing examples of electric appliances.

FIG. 14A is a portable telephone which comprises: a main body 2001, a voice output portion 2002, a voice input portion 2003, a display portion 2004, operation switches 2005, and an antenna 2006. The electronic device of the present invention can be applied to the display portion 2004.

Figure 14B:
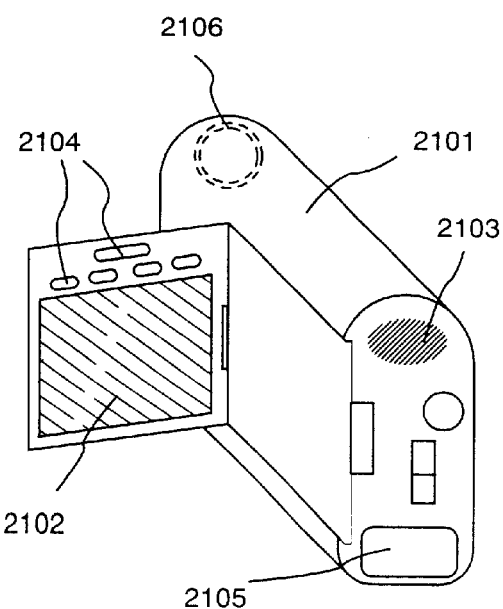

FIG. 14B is a video camera which comprises: a main body 2101; a display portion 2102, a voice input section 2103; operation switches 2104; a battery 2105 and an image receiving section 2106. The electronic device of the present invention can be applied to the display portion 2102.

Figure 14C:
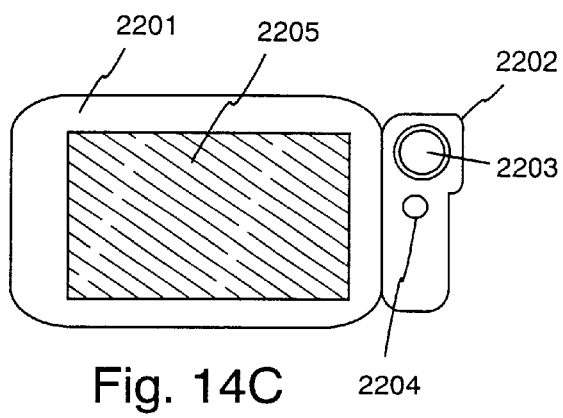

FIG. 14C is a mobile computer which comprises: a main body 2201; a camera section 2202; an image receiving section 2203; operation switches 2204 and a display portion 2205. The electronic device of the present invention can be applied to the display portion 2205.

Figure 14D:
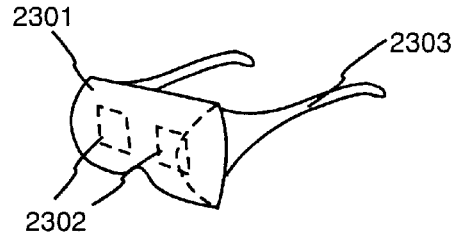

FIG. 14D is a goggle type display which comprises: a main body 2301; a display portion 2302; and an arm section 2303. The electronic device of the present invention can be applied to the display portion 2302.

Figure 14E:
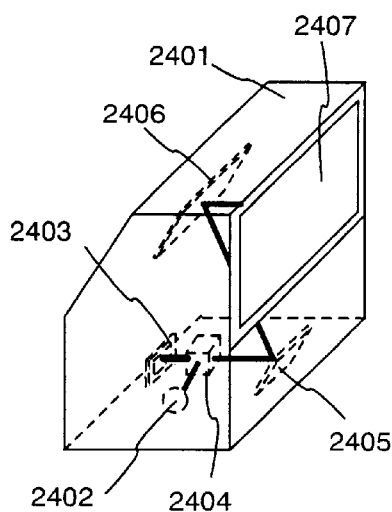

FIG. 14E is a rear type projector (projection TV) which comprises: a main body 2401; a light source 2402; a liquid crystal display device 2403; a polarization beam splitter 2404; reflectors 2405 and 2406; and a screen 2407. The present invention can be applied to a liquid crystal display device 2403.

Figure 14F:
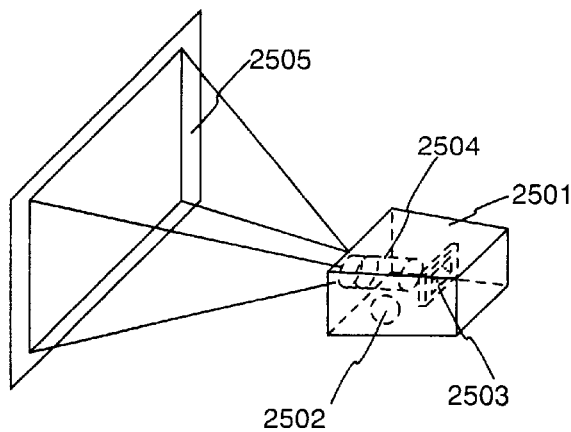

FIG. 14F is a front type projector which comprises: a main body 2501; a light source 2502; a liquid crystal display device 2503; an optical system 2504; and a screen 2505. The present invention can be applied to a liquid crystal display device 2503.

As mentioned above, the application range of the present invention is extremely wide, and the invention can be applied to electronic equipments in all fields. Further, any constitution of the electronic equipments shown in embodiments 1 to 5 may be employed in embodiment 6.

With an active matrix display device having a storage capacitor fabricated according to the present invention, the quality of display can be improved while high definition of the display device can be achieved because a sufficient amount of the storage capacitance can be reserved even with the reduced area for one pixel.

Moreover, the present invention can improve the storage property and the reliability of display devices such as the liquid crystal display device using the present invention. In addition, by fabricating an electric device using the present invention, the quality and the reliability of electric appliances using the electric device as its display area can be improved.

What is claimed is:

1. An active matrix display device comprising:
at least one pixel thin film transistor over a substrate, said pixel thin film transistor comprising at least an active layer and a gate electrode adjacent to said active layer with a gate insulating film interposed therebetween;
a pixel electrode formed over said at least one pixel thin film transistor, and electrically connected to said active layer; and
a storage capacitor formed below said gate electrode and said active layer,
wherein said storage capacitor comprises a first conductive layer on said substrate, a second conductive layer over said first conductive layer with a dielectric interposed the between.

2. An active matrix display device according to claim 1, wherein said storage capacitor includes a pair of capacitor wirings, and one of said pair of capacitor wirings is electrically connected to said active layer of said pixel thin film transistor through a wiring.

3. An active matrix display device according to claim 1, wherein said storage capacitor includes a pair of capacitor wirings, and one of said pair of capacitor wirings is connected to said active layer of said pixel thin film transistor.

4. An active matrix display device according to claim 1, wherein said storage capacitor includes a pair of capacitor wirings, and one of said pair of capacitor wirings comprises a material having a light-shielding property.

5. An active matrix display device according to claim 1, wherein said display device is an EL display device.

6. An active matrix display device according to claim 1, wherein said display device is incorporated in at least one selected from the group consisting of a portable telephone, a video camera, a mobile computer, a goggle type display, and a projector.

7. An active matrix display device comprising:
at least one pixel thin film transistor over a substrate, said pixel thin film transistor comprising at least an active layer and a gate electrode adjacent to said active layer with a gate insulating film interposed therebetween; and
a plurality of storage capacitors interposed between said substrate and said pixel thin film transistor,
wherein said plurality of storage capacitors are vertically arranged with respect to said substrate.

8. An active matrix display device according to claim 7, wherein each of said plurality of storage capacitors includes a pair of capacitor wirings, and one of said pair of capacitor wirings is electrically connected to said active layer of said pixel thin film transistor through a wiring.

9. An active matrix display device according to claim 7, wherein each of said plurality of storage capacitors includes a pair of capacitor wirings, and one of said pair of capacitor wirings is connected to said active layer of said pixel thin film transistor.

10. An active matrix display device according to claim 7, wherein said plurality of storage capacitors include a first storage capacitor over said substrate and a second storage capacitor over said first storage capacitor,
wherein said first storage capacitor includes a first capacitor wiring on said substrate, a first dielectric on said first capacitor wiring, and a second capacitor wiring on said first dielectric, and
wherein said second storage capacitor includes said second capacitor wiring, a second dielectric on said second capacitor wiring, and a third capacitor wiring on said second dielectric.

11. An active matrix display device according to claim 7, wherein each of said plurality of storage capacitor includes a pair of capacitor wirings, and one of said pair of capacitor wirings comprises a material having a light-shielding property.

12. An active matrix display device according to claim 7, wherein said display device is an EL display device.

13. An active matrix display device according to claim 7, wherein said display device is incorporated in at least one selected from the group consisting of a portable telephone, a video camera, a mobile computer, a goggle type display, and a projector.

14. An active matrix display device comprising:
a first conductive layer over a substrate;
a first insulating film on said first conductive layer;
a second conductive layer on said first insulating film;
a second insulating film on said second conductive layer; and
a pixel thin film transistor over said second insulating film, said pixel thin film transistor comprising at least an active layer and a gate electrode adjacent to said active layer with a gate insulating film interposed therebetween,
wherein said active layer is electrically connected to said first conductive layer.

15. An active matrix display device according to claim 14, wherein said first and said second conductive layers comprise one or an alloy selected from the group consisting of Ta, Ti, Mo, W, Cr, and Si.

16. An active matrix display device according to claim 14, further comprising a pixel electrode electrically connected to said active layer.

17. An active matrix display device according to claim 14, wherein said display device is an EL display device.

18. An active matrix display device according to claim 14, wherein said display device is incorporated in at least one selected from the group consisting of a portable telephone, a video camera, a mobile computer, a goggle type display, and a projector.

19. An active matrix display device comprising:
a first conductive layer over a substrate;
a first insulating film on said first conductive layer;
a second conductive layer on said first insulating film;
a second insulating film on said second conductive layer;
a third conductive layer on said second insulating film;
a third insulating film on said third conductive layer;
a pixel thin film transistor over said third insulating film, said pixel thin film transistor comprising at least an active layer and a gate electrode adjacent to said active layer with a gate insulating film interposed therebetween,
wherein said active layer is electrically connected to said second conductive layer.

20. An active matrix display device according to claim 19, wherein said first, second, and third conductive layers comprise one or an alloy selected from the group consisting of Ta, Ti, Mo, W, Cr, and Si.

21. An active matrix display device according to claim 19, wherein said first and said third conductive layers are electrically connected.

22. An active matrix display device according to claim 19, further comprising a pixel electrode electrically connected to said active layer.

23. An active matrix display device according to claim 19, wherein said display device is an EL display device.

24. An active matrix display device according to claim 19, wherein said display device is incorporated in at least one selected from the group consisting of a portable telephone, a video camera, a mobile computer, a goggle type display, and a projector.

25. An active matrix display device comprising:
a first conductive layer over a substrate;
a first insulating film on said first conductive layer;
a second conductive layer on said first insulating film;
a second insulating film on said second conductive layer; and
a pixel thin film transistor over said second insulating film, said pixel thin film transistor comprising at least an active layer and a gate electrode adjacent to said active layer with a gate insulating film interposed therebetween,
wherein a storage capacitor is formed between said first and said second conductive layers.

26. An active matrix display device according to claim 25, wherein said first and said second conductive layers comprise one or an alloy selected from the group consisting of Ta, Ti, Mo, W, Cr, and Si.

27. An active matrix display device according to claim 25, further comprising a pixel electrode electrically connected to said active layer.

28. An active matrix display device according to claim 25, wherein said display device is an EL display device.

29. An active matrix display device according to claim 25, wherein said display device is incorporated in at least one selected from the group consisting of a portable telephone, a video camera, a mobile computer, a goggle type display, and a projector.

30. An active matrix display device comprising:
a first conductive layer over a substrate;
a first insulating film on said first conductive layer;
a second conductive layer on said first insulating film;
a second insulating film on said second conductive layer;
a third conductive layer on said second insulating film;
a third insulating film on said third conductive layer;
a pixel thin film transistor over said third insulating film, said pixel thin film transistor comprising at least an active layer and a gate electrode adjacent to said active layer with a gate insulating film interposed therebetween; and
a plurality of storage capacitors interposed between said substrate and said pixel thin film transistor,
wherein said plurality of storage capacitors are vertically arranged with respect to said substrate, and
wherein said active layer is electrically connected to said second conductive layer.

31. An active matrix display device according to claim 30, wherein said first, second, and third conductive layers comprise one or an alloy selected from the group consisting of Ta, Ti, Mo, W, Cr, and Si.

32. An active matrix display device according to claim 30, wherein said first and said third conductive layers are electrically connected.

33. An active matrix display device according to claim 30, further comprising a pixel electrode electrically connected to said active layer.

34. An active matrix display device according to claim 30, wherein said display device is an EL display device.

35. An active matrix display device according to claim 30, wherein said display device is incorporated in at least one selected from the group consisting of a portable telephone, a video camera, a mobile computer, a goggle type display, and a projector.

* * * * *